(12) United States Patent
Tangring et al.

(10) Patent No.: US 11,195,978 B2
(45) Date of Patent: Dec. 7, 2021

(54) METHOD FOR PRODUCING A MULTIPLICITY OF RADIATION-EMITTING SEMICONDUCTOR COMPONENTS, AND RADIATION-EMITTING SEMICONDUCTOR COMPONENT

(71) Applicant: OSRAM Opto Semiconductors GmbH, Regensburg (DE)

(72) Inventors: Ivar Tangring, Regensburg (DE); Thomas Schlereth, Pentling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/496,075

(22) PCT Filed: Mar. 21, 2018

(86) PCT No.: PCT/EP2018/057133
§ 371 (c)(1),
(2) Date: Sep. 20, 2019

(87) PCT Pub. No.: WO2018/184843
PCT Pub. Date: Oct. 11, 2018

(65) Prior Publication Data
US 2020/0044126 A1 Feb. 6, 2020

(30) Foreign Application Priority Data
Apr. 4, 2017 (DE) .......................... 102017107234.9

(51) Int. Cl.
*H01L 33/00* (2010.01)
*H01L 33/50* (2010.01)
*H01L 33/48* (2010.01)

(52) U.S. Cl.
CPC .......... *H01L 33/505* (2013.01); *H01L 33/486* (2013.01); *H01L 2933/0033* (2013.01);
(Continued)

(58) Field of Classification Search
CPC combination set(s) only.
See application file for complete search history.

(56) References Cited

U.S. PATENT DOCUMENTS

2010/0276706 A1* 11/2010 Herrmann ............... H01L 33/62
257/89
2014/0001949 A1* 1/2014 Kimura ................... H05B 33/10
313/498
(Continued)

FOREIGN PATENT DOCUMENTS

DE 102014221722 A1 4/2016
DE 102016108931 A1 11/2017
(Continued)

*Primary Examiner* — Niki H Nguyen
(74) *Attorney, Agent, or Firm* — Slater Matsil, LLP

(57) ABSTRACT

A method for producing a plurality of radiation-emitting semiconductor components and a radiation-emitting semiconductor component are disclosed. In an embodiment a method includes providing an auxiliary carrier, applying a first structured wavelength converting layer to the auxiliary carrier comprising a plurality of structural elements, filling regions between the structural elements with a first reflective casting compound and applying a radiation-emitting semiconductor chip with its front side to one structural element of the first structured wavelength converting layer in each case.

28 Claims, 14 Drawing Sheets

(52) U.S. Cl.
CPC ........... *H01L 2933/0041* (2013.01); *H01L 2933/0058* (2013.01)

(56) References Cited

U.S. PATENT DOCUMENTS

| | | |
|---|---|---|
| 2014/0217436 A1 | 8/2014 | Hussell et al. |
| 2015/0311405 A1* | 10/2015 | Oyamada ........... H01L 33/60 257/98 |
| 2016/0293810 A1 | 10/2016 | Baike et al. |
| 2019/0157522 A1 | 5/2019 | Albrecht et al. |

FOREIGN PATENT DOCUMENTS

| | | |
|---|---|---|
| EP | 2393131 A1 | 12/2011 |
| EP | 2680331 A2 | 1/2014 |
| WO | 2013175338 A | 11/2013 |

* cited by examiner

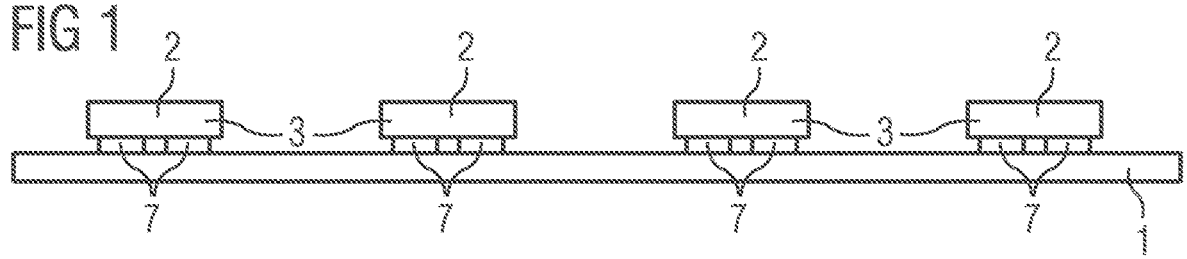
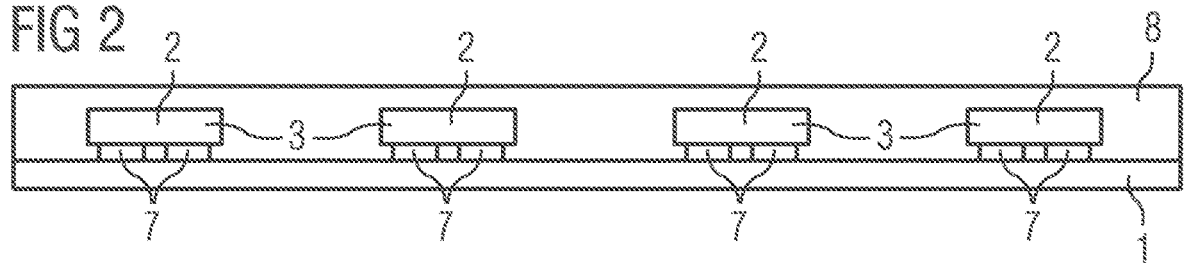
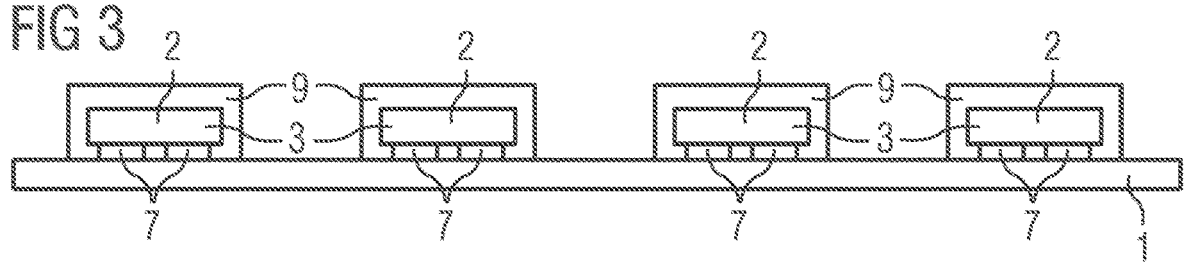
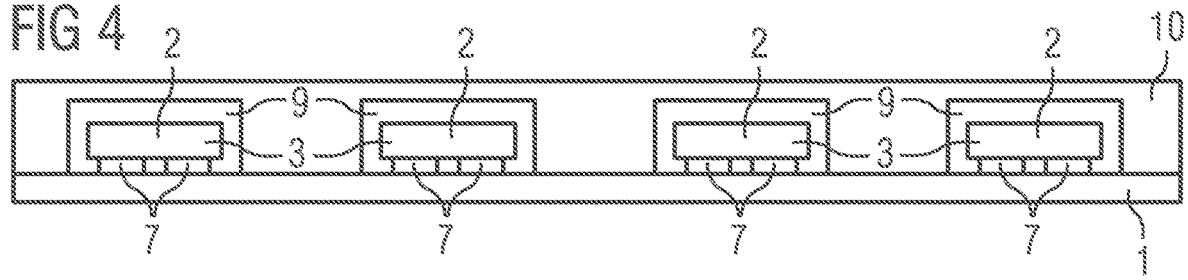
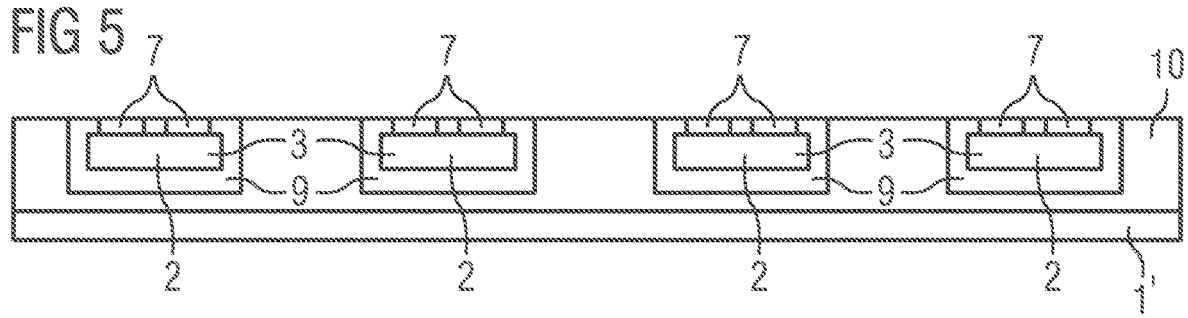

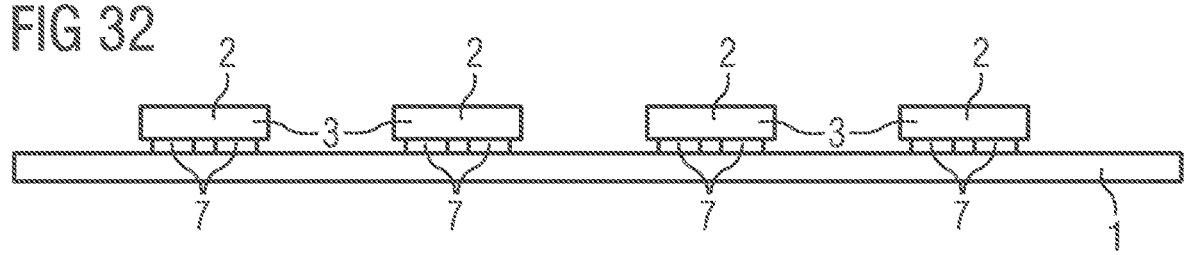
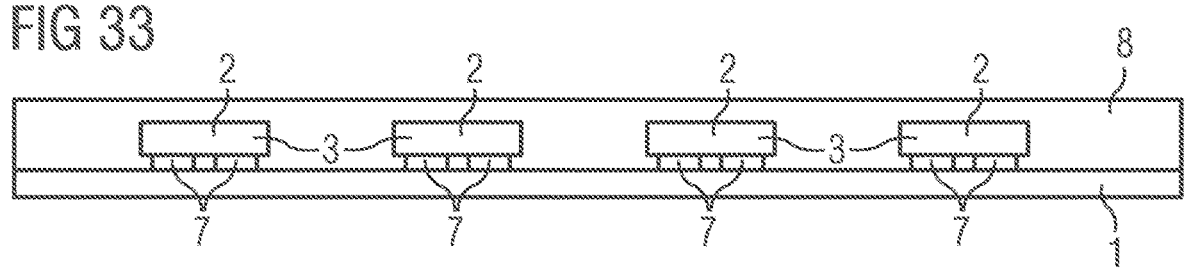
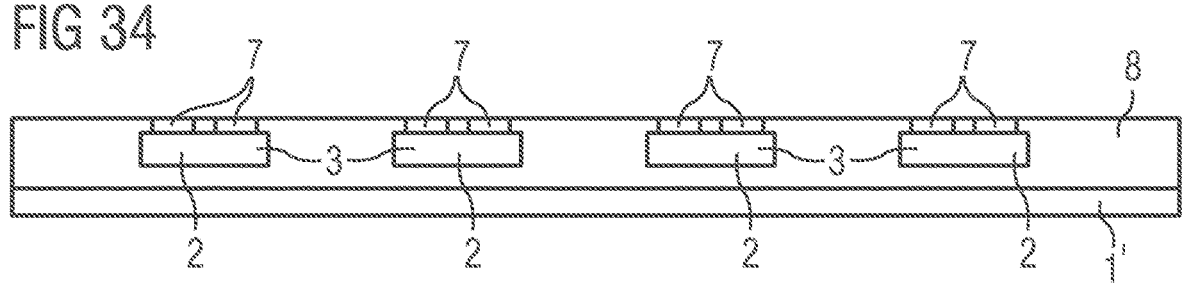

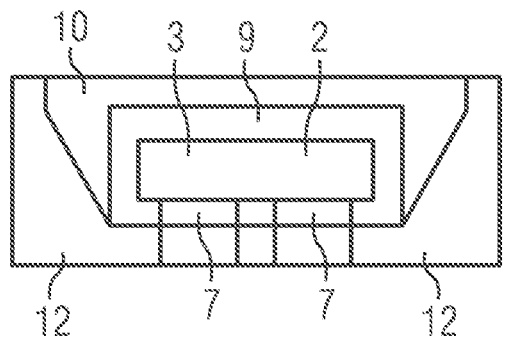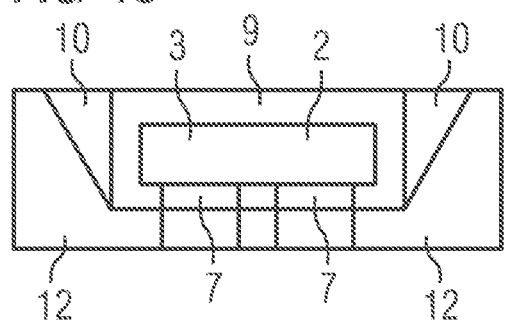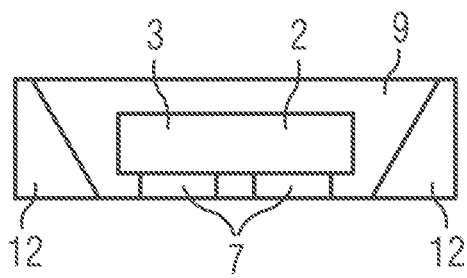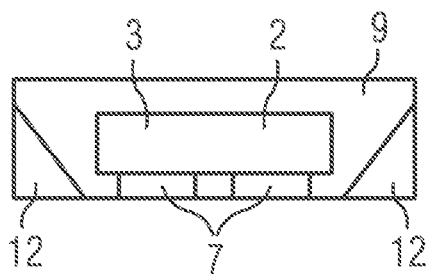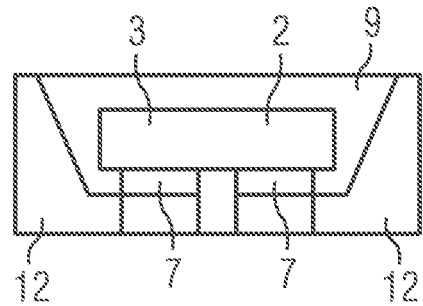

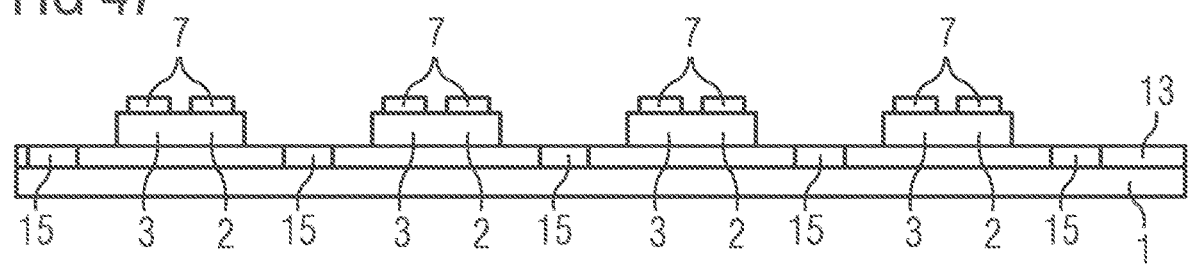
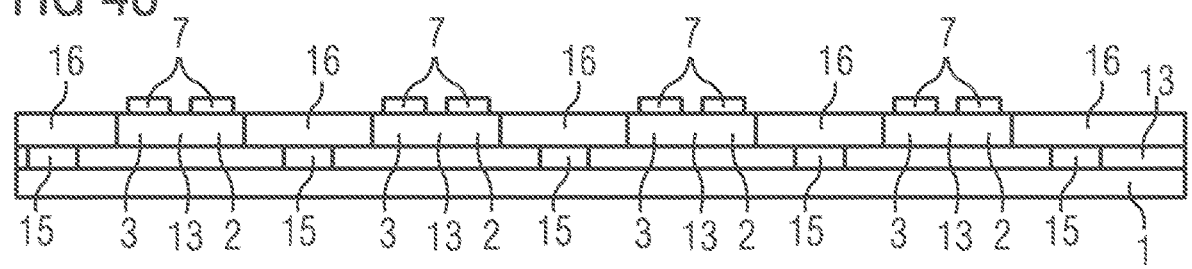
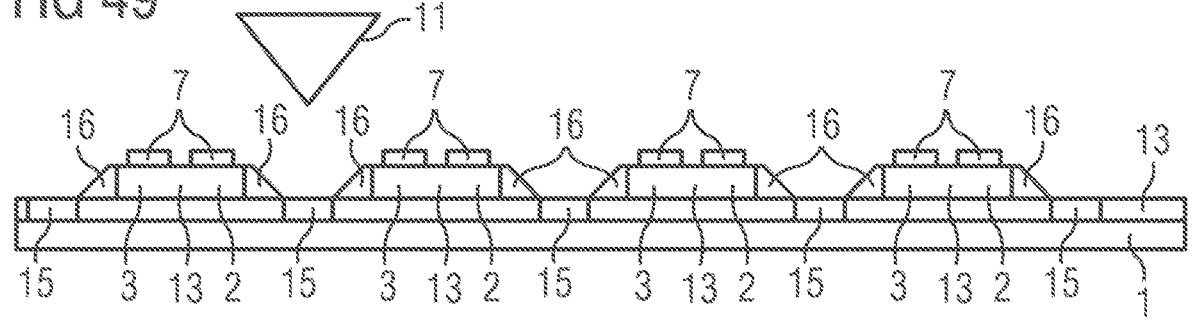

METHOD FOR PRODUCING A MULTIPLICITY OF RADIATION-EMITTING SEMICONDUCTOR COMPONENTS, AND RADIATION-EMITTING SEMICONDUCTOR COMPONENT

This patent application is a national phase filing under section 371 of PCT/EP2018/057133, filed Mar. 21, 2018, which claims the priority of German patent application 102017107234.9, filed Apr. 4, 2017, each of which is incorporated herein by reference in its entirety.

TECHNICAL FIELD

The invention relates to methods for manufacturing a plurality of radiation-emitting semiconductor devices and a radiation-emitting semiconductor device.

BACKGROUND

A method for manufacturing radiation-emitting semiconductor devices and radiation-emitting semiconductor devices are described, for example, in U.S. Patent Publication No. 2016/0293810 A1.

SUMMARY OF THE INVENTION

Embodiments provide a simplified manufacturing method for the production of a plurality of radiation-emitting semiconductor devices. Further embodiments provide a radiation-emitting semiconductor device with a small design and a lateral reflector.

In a method for manufacturing a plurality of radiation-emitting semiconductor devices, an auxiliary carrier is provided according to an embodiment.

A plurality of radiation-emitting semiconductor chips is applied with their back sides to the auxiliary carrier according to an embodiment of the method. As a rule, the back sides of the semiconductor chips are at least partially intended for later assembly of the finished semiconductor devices on a connection carrier. As a rule, the back side of the semiconductor chips has at least one electrical contact. A front side of the semiconductor chips is opposite to the back side of the semiconductor chips and usually includes at least a part of the radiation exit surface of the semiconductor chip.

According to a further embodiment of the method, a first casting compound is applied in such a way that a semiconductor chip compound is formed. The first casting compound can be applied by molding, casting or dispensing.

Finally, the semiconductor chip compound is separated between two, preferably directly adjacent, semiconductor chips by sawing, whereby the auxiliary carrier is not cut through. At least one layer of the first casting compound is formed on each side face of the semiconductor chips. The layer of the first casting compound can cover the side faces of the semiconductor chips completely or partially.

At present, with semiconductor chip compound is not just an element indicated that comprises several semiconductor chips and at least one casting compound and forms a connected element. Rather, the term "semiconductor chip compound" is also used to describe an element with several semiconductor chips and casting compound on the auxiliary carrier, in which the casting compound is cut through to the auxiliary carrier by means of separation.

The auxiliary carrier can, for example, have a basic body made of steel, glass or plastic. The base body can, for example, be provided with an adhesive film for fixing the semiconductor chips. Furthermore, it is also possible that a liquid adhesive for fixing the semiconductor chips is sprayed onto the auxiliary carrier.

The first casting compound may, for example, contain one of the following materials or can consist of one of the following materials: silicone resin, epoxy resin or a mixture of these both materials.

According to a preferred embodiment of the method, the first casting compound and/or the second casting compound is separated by sawing, so that by sawing the first casting compound and/or the second casting compound, an oblique outer surface is formed, which preferably has a convex curvature.

According to a further embodiment of the method, the first casting compound is wavelength-converting and the semiconductor chip compound is separated such through the first casting compound that a wavelength-converting layer is formed on the radiation exit surface and the side faces of each semiconductor chip.

Particularly preferably, semiconductor chips that are embodied as flip chips are used at present. A flip chip has a carrier with a first main surface and a second main surface opposite the first main surface. On the second main surface, an epitaxial semiconductor layer sequence is arranged with a radiation-generating active zone and preferably grown epitaxially. The carrier is usually transmissive at least for the electromagnetic radiation generated in the active zone. For example, the carrier has one of the following materials or is formed from one of the following materials: sapphire, silicon carbide.

The first main surface of the carrier usually partially forms the radiation exit surface of the flip chip. Furthermore, the side faces of the carrier usually also form part of the radiation exit surface of the flip chip. As a rule, two electrical contacts are arranged on the back side of the flip chip and are intended for electrical contacting of the semiconductor chip. The front side of the flip chip is usually free of electrical contacts.

According to an embodiment of the method, each semiconductor chip has a radiation transmissive carrier, which has a first main surface and side faces, which together form a radiation exit surface of the semiconductor chip. For example, the semiconductor chips are flip chips. In this embodiment of the method, the first casting compound is preferably wavelength-converting, which means that the casting compound is suitable for converting electromagnetic radiation of a first wavelength range into electromagnetic radiation of a second wavelength range. For example, the wavelength-converting casting compound converts electromagnetic radiation generated in the active zone into electromagnetic radiation of a different wavelength range. For example, the finished semiconductor devices emit converted and unconverted radiation that has a color locus in the white region of the CIE standard chromaticity diagram. In this embodiment, the semiconductor chip compound is preferably separated such through the first wavelength-converting casting compound that a wavelength-converting layer is formed on the first main surface of the carrier and on the side faces of the carrier.

The first wavelength converting casting compound can, for example, contain a resin, such as a silicone, an epoxy or a mixture of these materials, in which phosphor particles are incorporated. The phosphor particles give the first wavelength-converting casting compound its wavelength-converting properties.

In particular, the wavelength-converting layer, which is arranged on the side faces of the carrier, shows saw traces due to the separation method.

The wavelength converting layer has preferably a thickness between 30 micrometer and 100 micrometer, inclusive. For example, the wavelength converting layer has a thickness of approximately 50 micrometer. On the first main surface of the carrier, the wavelength-converting layer has preferably a deviation from an average layer thickness, which is not greater than 2.4 micrometer. The wavelength-converting layer on the side faces of the carrier has preferably a deviation from an average layer thickness, which is not greater than 10 micrometer.

According to a further embodiment of the method, a second clear casting compound is applied to the semiconductor chip compound, for example, by molding, casting or dispensing. The second clear casting compound can, for example, be a silicone, an epoxy resin, a mixture of these materials or one of these materials. The semiconductor chip compound is then separated by sawing between two semiconductor chips through the second clear casting compound, whereby the auxiliary carrier is again not cut through. On the side faces of the wavelength-converting layer, a layer of the second clear casting compound is formed, preferably with an oblique outer surface. To ensure that the second clear casting compound has an oblique outer surface on the side faces of the wavelength-converting layer, a saw blade with a wedge-shaped profile is preferably used for cutting in the sawing method.

With oblique outer surface it is meant here and in the following that the outer surface can be plan or curved. A curved outer surface is preferably convex. If an oblique outer surface includes an angle with a straight line or a plane, a tangent to the outer surface can be used as the reference straight line of the curved outer surface.

According to a further embodiment of the method, the second clear casting compound is applied in such a way that it fills the gaps between the semiconductor chips up to a surface of the wavelength-converting layer, so that the second clear casting compound and the wavelength-converting layer are flush with each other. The wavelength-converting layer on the first main surface of the carrier is preferably free of the second clear casting compound.

Alternatively, it is also possible that the second clear casting compound is also applied to the wavelength-converting layer on the first main surface of the carrier and a layer of the second clear casting compound is formed here with as homogeneous a thickness as possible.

According to a further embodiment of the method, the second clear casting compound is applied in such a way that it fills the gaps between the semiconductor chips up to a surface of the wavelength-converting layer, so that the second clear casting compound and the wavelength-converting layer are flush with each other. The wavelength-converting layer on the first main surface of the carrier is preferably free of the second clear casting compound.

Alternatively, it is also possible that the second clear casting compound is also applied to the wavelength-converting layer on the first main surface of the carrier and a layer of the second clear casting compound is formed here with as homogeneous a thickness as possible.

According to a further embodiment of the method, the first casting compound is wavelength-converting. The first wavelength-converting casting compound is preferably completely cut through to the auxiliary carrier. In other words, the semiconductor chip compound in this embodiment does not form a connected element after the separation of the first wavelength-converting casting compound. Instead, individual semiconductor chips are arranged on the auxiliary carrier, each of which is at least partially covered by a wavelength-converting layer.

Alternatively, it is also possible that the first wavelength-converting casting compound is not completely cut through to the auxiliary carrier, so that a remainder of the wavelength-converting casting compound remains on the auxiliary carrier. With this embodiment of method, the separated semiconductor chip compound thus forms a connected element.

For example, the first wavelength-converting casting compound, which remains on the auxiliary carrier after separation, has a thickness of between 10 micrometers and 100 micrometers in the vertical direction, i.e., perpendicular to a main extension plane of the auxiliary carrier.

The casting compounds can be separated with a saw blade with a wedge-shaped profile. In this way, the outer surface of the resulting layer is formed oblique.

According to a further embodiment of the method, a third reflective casting compound is applied to the semiconductor chip compound, for example, by molding, casting or dispensing. The semiconductor chip compound is then separated by sawing between two semiconductor chips through the third reflective casting compound, whereby the auxiliary carrier is not cut through. The third reflective casting compound preferably forms a reflector for electromagnetic radiation, which is generated in the active zone of the semiconductor chips and emitted from the radiation exit surface.

For example, the reflective casting compound is applied in direct contact to a wavelength-converting layer or to a layer of clear casting compound that has oblique outer surfaces and was obtained by sawing with a wedge-shaped saw blade. In particular, the interface, which is formed by the oblique outer surface and the reflective casting compound, is generally suitable for acting as a reflector.

For example, the third reflective casting compound is formed from a resin, such as silicone, epoxy or a mixture of these materials, in which reflective particles are incorporated. In general, the reflective particles give the reflective properties to the third reflective casting compound. For example, the reflecting particles are titanium dioxide particles. The reflective particles preferably have a high degree of filling in the casting compound. The degree of filling of the reflective particles in the casting compound is preferably at least 60% by weight, particularly preferably at least 70% by weight.

The first casting compound, the second casting compound and/or the third casting compound preferably replace a prefabricated housing together, in pairs or individually. Preferably, the radiation-emitting semiconductor devices are free of a prefabricated housing. The casting compound(s) mechanically stabilize the semiconductor device.

According to a further embodiment of the method, the auxiliary carrier is removed so that at least one rear electrical contact of each semiconductor chip is freely accessible. Preferably, flip chips, which comprise two rear electrical contacts are, used as semiconductor chips. In this embodiment of the method, both rear electrical contacts of each semiconductor chip are freely accessible after removal of the auxiliary carrier. In this embodiment of the method, another auxiliary carrier is preferably applied to the freely accessible main surface of the semiconductor chip compound before the auxiliary carrier is removed.

The exposed rear electrical contacts of the semiconductor chips are preferably galvanically reinforced using a galvanic method. Preferably, the electrical contacts are comparatively thick after galvanic reinforcement. For example, the electrical contacts after galvanic reinforcement have a thickness of between 30 micrometers and 75 micrometers, inclusive. Preferably, the electrical contacts after galvanic reinforcement have a thickness between 50 micrometers and 75 micrometers, inclusive.

Electrical contacts that are comparatively thick have the advantage of providing mechanical stability to the semiconductor device and can also be used as a mechanical buffer element that can absorb mechanical stress on the finished semiconductor device. In addition, thick electrical contacts form an effective barrier to a solder layer with which the semiconductor device can be mounted with its back side on a connection carrier.

According to further embodiment of the method, semiconductor chips are used, which are already provided with a wavelength-converting layer. In other words, semiconductor chips that are already provided with a wavelength-converting layer are preferably applied to the auxiliary carrier.

According to another embodiment of the method, a structured wavelength-converting layer is applied to the auxiliary carrier. The structured wavelength-converting layer has a plurality of structural elements. Preferably, the first structured layer is applied in direct contact on the auxiliary carrier.

According to an embodiment of the method, the regions between the structural elements are filled with a first reflective casting compound. The first reflective casting compound can be applied between the structural elements by dispensing. Preferably, the regions between the structural elements are completely filled with the first reflective casting compound. Particularly preferably, the first reflective casting compound is flush with the structural elements.

According to a further embodiment of the method, a radiation-emitting semiconductor chip is applied with its front side to one structural element of the first wavelength-converting, structured layer.

According to a further embodiment of the method, the first structured wavelength-converting layer is formed by a resin, such as silicone, epoxy resin or a mixture of these materials, in which phosphor particles are incorporated. For example, the first structured wavelength-converting layer is applied to the auxiliary carrier by screen printing.

The structural elements of the first structured wavelength-converting layer are particularly preferred not cured before the radiation-emitting semiconductor chips are placed on the first structured wavelength-converting layer. As a result, the semiconductor chips adhere to the structural elements, such that no adhesive is required to fix the semiconductor chips to the structural elements with advantage.

According to a preferred embodiment of the method, the structural elements are embodied rectangular. A side length of the rectangular structural element has, for example, a length between 1 millimeter and 4 millimeters. The rectangular structural elements are preferably arranged in rows and columns. The first reflective casting compound preferably forms a grid herein.

For example, the first structured wavelength-converting layer has a thickness between 30 micrometers and 100 micrometers. Preferably, the thickness of the first structured wavelength-converting layer is approximately 50 micrometer.

According to a further embodiment of the method, gaps between the semiconductor chips are filled, preferably completely, with a second wavelength-converting casting compound. The application of the second wavelength-converting casting compound can be carried out, for example, by molding, casting or dispensing. The second wavelength-converting casting compound is preferably flush with a second main surface of the carrier of the semiconductor chips.

According to a further embodiment of the method, the second wavelength-converting casting compound is separated between two directly adjacent semiconductor chips up to the first reflecting casting compound by sawing, so that a second wavelength-converting layer is formed on side faces of each semiconductor chip. This preferably results in oblique outer surfaces of the second wavelength-converting layer. This can be achieved, for example, by sawing with a saw blade, which has a wedge-shaped profile. The oblique outer surfaces of the second wavelength-converting layer are preferably flush with the side faces of the underlying structural element.

According to a further embodiment of the method, a second reflective casting compound is applied to the semiconductor chips, wherein the second main surfaces of the electrical contacts are freely accessible. The second reflective casting compound can be applied, for example, by molding, casting or dispensing.

Also, with this method it is possible to galvanically reinforce the electrical contacts of the semiconductor chips, as already described above.

According to a further embodiment of the method, the second reflective casting compound is cut through by sawing so that outer surfaces of the second reflective casting compound are formed, which are perpendicular to a main extension plane of the auxiliary carrier.

The present methods are based, among other things, on the idea of using a sawing method to precisely define the geometry of a casting compound that can be clear, reflective or wavelength-converting. In particular, this simplifies a manufacturing method for radiation-emitting semiconductor devices. The casting compound is preferably applied unstructured before the sawing method with molding, casting or dispensing. These methods are with advantage comparatively simple, but usually do not allow an exact definition of a geometry. This is then achieved using the sawing method.

By abstaining from a prefabricated housing, it is particularly possible to achieve a design as small as possible for the semiconductor device.

The methods described above are particularly suitable for manufacturing a radiation-emitting semiconductor device. Consequently, features which are described herein only in connection with the methods can also be embodied in the radiation-emitting semiconductor device and vice versa.

According to an embodiment, the radiation-emitting semiconductor device comprises a semiconductor chip with a radiation-transmissive carrier. An epitaxial semiconductor layer sequence is applied to the carrier. The semiconductor chip further comprises a mirror layer, which is deposited on the epitaxial semiconductor layer sequence and which is intended to direct electromagnetic radiation generated in an active zone of the epitaxial semiconductor layer sequence to a radiation exit surface of the semiconductor chip. Furthermore, the semiconductor chip preferably comprises two electrical contacts arranged at a back side of the semiconductor chip. In other words, the semiconductor chip is preferably a flip chip.

According to an embodiment of the radiation-emitting semiconductor device, it comprises a wavelength-converting layer that completely covers the side faces of the carrier and a first main surface of the carrier. The wavelength-converting layer on the side faces of the carrier preferably has saw traces. The saw traces can increase the coupling out of radiation from the wavelength-converting layer with advantage.

According to further embodiment of the radiation-emitting semiconductor device, the semiconductor chip is enveloped in a reflective casting compound, with the first main surfaces of the electrical contacts being freely accessible.

According to an embodiment of the radiation-emitting semiconductor device, the wavelength-converting layer on the side faces of the carrier has a first thickness whose thickness variation is not greater than 25%.

According to a further embodiment of the radiation-emitting semiconductor device, the wavelength-converting layer on the first main surface of the carrier has a second thickness whose thickness variation is not greater than 5%.

According to a further embodiment of the radiation-emitting semiconductor device, a second clear casting compound, which has an oblique outer surface, is arranged at the side faces of the carrier on the wavelength-converting layer. The reflective casting compound envelops the semiconductor chip and the second clear casting compound. Preferably, the reflective casting compound forms an interface with the oblique outer surface of the second clear casting compound. This interface acts preferably as a reflector for the electromagnetic radiation emitted by the semiconductor chip.

According to a further embodiment of the radiation-emitting semiconductor device, the wavelength-converting layer on the first main surface of the carrier is also completely covered by the second clear casting compound.

According to a further embodiment of the radiation-emitting semiconductor device, the wavelength-converting layer on the side faces of the carrier has an oblique outer surface. Here, side faces of the semiconductor device can be partially formed by material of the wavelength-converting layer. For example, the oblique outer surface of the wavelength-converting layer includes an angle α between 30° and 80°, inclusive, with the normal of a main extension plane of the carrier. Preferably, the angle α has a value that lies between 45° and 60°, inclusive. Herein lead larger angles usually to a larger design of the semiconductor device.

According to a preferred embodiment of the semiconductor device, the oblique outer surface of the first wavelength-converting casting compound or the outer surface of the second clear casting compound is curved, preferably convex curved. This improves the deflection of electromagnetic radiation, which is laterally coupled out from the epitaxial semiconductor layer sequence, to a radiation exit surface of the semiconductor device. As a rule, there is a comparatively large refractive index difference between the material of the epitaxial semiconductor layer sequence and the material of the radiation transmissive carrier, so that a certain percentage of the electromagnetic radiation generated in the active zone does not enter the carrier due to total reflection and is emitted via the side faces of the epitaxial semiconductor layer sequence. The (convex) curved outer surface offers the advantage of a larger distance in the region of the epitaxial semiconductor layer sequence and thus ensures a particularly good deflection. The (convex) curved outer surface can be created by using an appropriately shaped saw blade.

According to a further embodiment of the radiation-emitting semiconductor device, the electrical contacts comprise two metallic layers, one of which is applied galvanically. For example, the galvanically applied metallic layer reinforces the first metallic layer so that the electrical contacts have a thickness between 30 micrometers and 75 micrometers, inclusive.

According to an embodiment of the radiation-emitting semiconductor device, the wavelength-converting layer on the first main surface of the carrier is formed of a different material than on the side faces of the carrier. For example, the wavelength-converting layer on the first main surface of the carrier differs from the wavelength-converting layer on the side faces of the carrier by a different matrix material. For example, a different silicone is used as a matrix material on the first main surface of the carrier than on the side faces. Furthermore, it is also possible that the wavelength-converting layer on the first main surface of the carrier has different phosphor particles than the wavelength-converting layer on the side faces of the carrier.

BRIEF DESCRIPTION OF THE DRAWINGS

Further advantageous embodiment and developments of the invention result from the exemplary embodiments described below in connection with the figures.

FIGS. 1 to 9 show schematic sectional views of a method according to a first exemplary embodiment;

FIGS. 32 to 37 show schematic sectional views of a method according to a further exemplary embodiment;

FIGS. 38 to 44 show schematic sectional views of a radiation-emitting semiconductor device according to one exemplary embodiment;

FIGS. 45 to 51 show schematic sectional views of a further method according to an exemplary embodiment.

Figure 6:
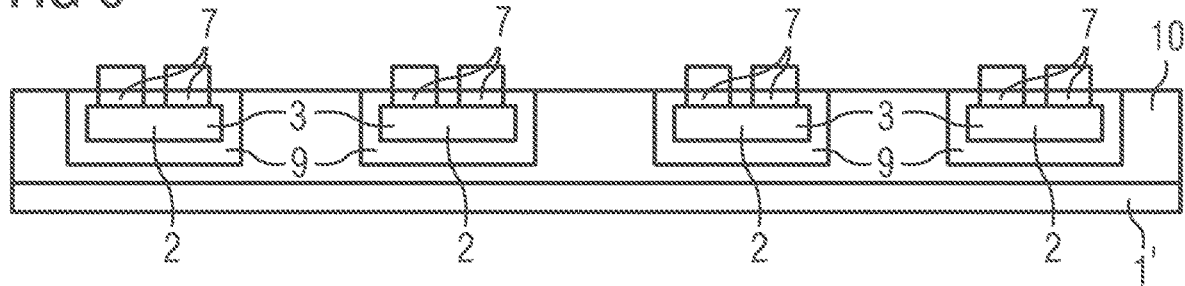

Equal or similar elements as well as elements of equal function are designated with the same reference signs in the figures. The figures and the proportions of the elements shown in the figures are not regarded as being shown to scale. Rather, single elements, in particular layers, can be shown exaggerated in magnitude for the sake of better presentation.

DETAILED DESCRIPTION OF ILLUSTRATIVE EMBODIMENTS

During the method according to the exemplary embodiment of FIGS. 1 to 9, an auxiliary carrier 1 is provided first. A plurality of radiation-emitting semiconductor chips 2 are applied with their back sides to the auxiliary carrier 1, for example, by gluing. The semiconductor chips 2 are flip chips.

Each radiation-emitting semiconductor chip 2 has a radiation transmissive carrier 3 with a first main surface and a second main surface, wherein the first main surface lies opposite to the second main surface. The first main surface and side faces of carrier 3 form a radiation exit surface of semiconductor chip 2.

Furthermore, the semiconductor chip 2 comprises an epitaxial semiconductor layer sequence 4 with an active zone 5, the semiconductor layer sequence 4 being applied to the second main surface of the carrier 3. A mirror layer 6 is applied to the epitaxial semiconductor layer sequence 4, at which two rear electrical contacts 7 are arranged. The electrical contacts 7 are intended to supply the semiconductor chip 2 with electrical current. For reasons of clarity, the active zone 5 together with the epitaxial semiconductor layer sequence 4 and the mirror layer 6 are not shown in FIGS. 1 to 37 and 39 to 51, but are shown in FIG. 38.

The electrical contacts 7 have a first main surface facing the carrier 3 and a second main surface facing away from the carrier 3. The electrical contacts 7 of the semiconductor chip 2 are located at a back side of the semiconductor chip 2. For example, the second main surfaces of the electrical contacts 7 partially form the back side of the semiconductor chip 2. The first main surface of carrier 3, which is part of the radiation exit surface of semiconductor chip 2, forms part of the front side of semiconductor chip 2.

As shown in FIG. 1, the semiconductor chips 2 are applied to the auxiliary carrier 1 with the second main surfaces of the electrical contacts 7 during the method according to the exemplary embodiment of FIGS. 1 to 9.

In a next step, which is schematically shown in FIG. 2, a first wavelength-converting casting compound 8 is applied to the auxiliary carrier 1 by molding, casting or dispensing. The first wavelength-converting casting compound 8 can completely fill the gaps between the semiconductor chips 2 as well as between the electrical contacts 7. Furthermore, the first wavelength-converting casting compound 8 is arranged in such a way that the first main surfaces of the carriers 3 are also completely covered with the first wavelength-converting casting compound 8. The first wavelength-converting casting compound 8 can, for example, be a silicone resin, in which phosphor particles are incorporated.

The electrical contacts 7 on the back side of the semiconductor chips 2 are comparatively thin. The electrical contacts 2 have initially a thickness between 1 micrometer and 2 micrometers, inclusive.

In a next step, which is shown schematically in FIG. 3, the first wavelength-converting casting compound 8 is completely cut through to the auxiliary carrier 1 by sawing. With the help of sawing, a wavelength-converting layer 9 is formed on the side faces of the semiconductor chips 2. Furthermore, the first wavelength-converting casting compound 8 also forms a wavelength-converting layer 9 on the first main surface of carrier 3. The wavelength-converting layer 9 on the side faces of carrier 3 has an outer surface, which is arranged perpendicular to a main extension plane of auxiliary carrier 1 and bears saw traces.

In a next step, which is schematically shown in FIG. 4, a second clear casting compound 10 is applied to the semiconductor chip compound according to FIG. 3, again by means of molding, casting or dispensing, for example. The second clear casting compound 10 can be formed from a silicone resin. The second clear casting compound 10 completely fills the gaps between the semiconductor chips 2 and forms a layer of the second clear casting compound 10 on the front sides of the wavelength-converting layer 9. The semiconductor chips 2 together with their wavelength-converting layers 9 are completely enveloped by the second clear casting compound 10.

In a next step, which is schematically shown in FIG. 5, a further auxiliary carrier 1', such as a foil, is applied to the exposed main surface of the semiconductor chip compound, which is formed by the second clear casting compound 10, for example, by laminating. Then, the other auxiliary carrier 1 is removed again so that the second main surfaces of the electrical contacts 7 of the semiconductor chips 2 are freely accessible.

In a next step, which is schematically shown in FIG. 6, the electrical contacts 7 of the semiconductor chips 2 are reinforced using a galvanic method, for example, by galvanically depositing a copper layer. In this way, the electrical contacts 7 of the semiconductor chip 2 have an increased thickness, for example, between 30 micrometers and 100 micrometers, inclusive.

Figure 7:
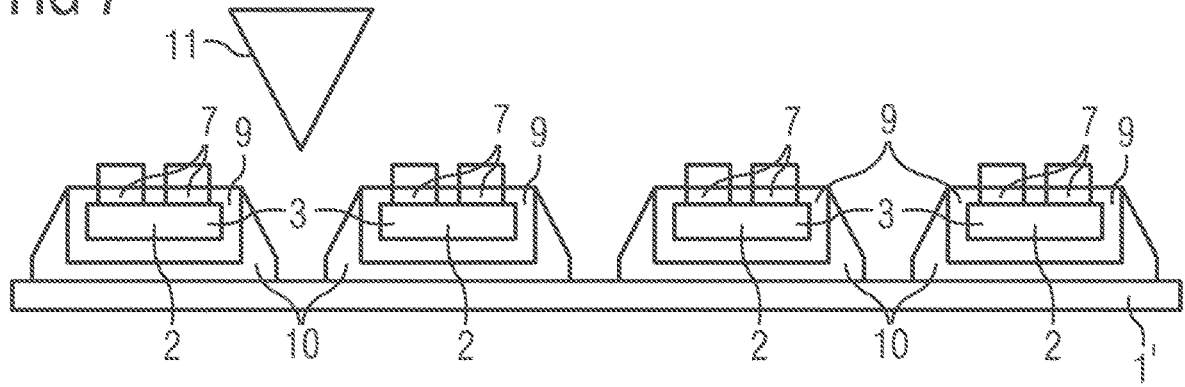

In a next step, which is schematically shown in FIG. 7, the second clear casting compound 10 is completely cut through by sawing to the further auxiliary carrier 1'. A saw blade 11 with a wedge-shaped profile is used, so that oblique outer surfaces of the second clear casting compound 10 arise.

Figure 8:
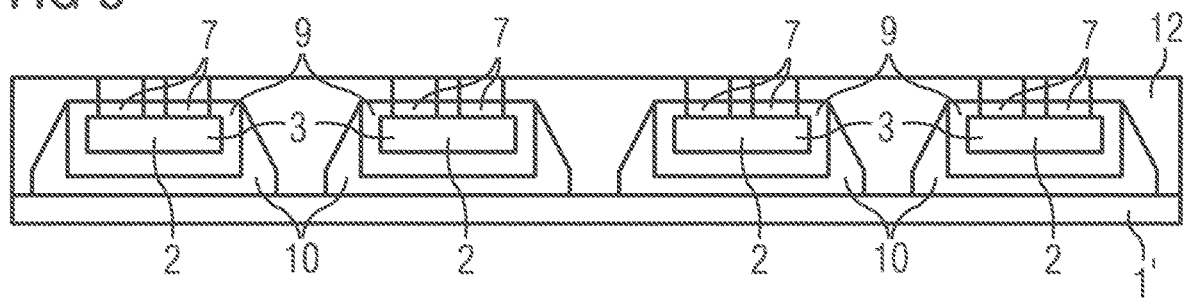

In a next step, which is schematically shown in FIG. 8, a third reflective casting compound 12 is applied to the other auxiliary carrier 1', which again completely envelops the semiconductor chips 2 with the applied first and second casting compounds 8 and 10. The third reflecting casting compound 12 completely fills the gaps between the semiconductor chips 2 and the casting compounds 8, 10 applied to them. Preferably, the semiconductor chips 2 with the first and second casting compounds 8, 10 are completely enveloped by the third reflecting casting compound 12, wherein only the second main surfaces of the electrical contacts 7 of the semiconductor chips 2 remain freely accessible.

Figure 9:
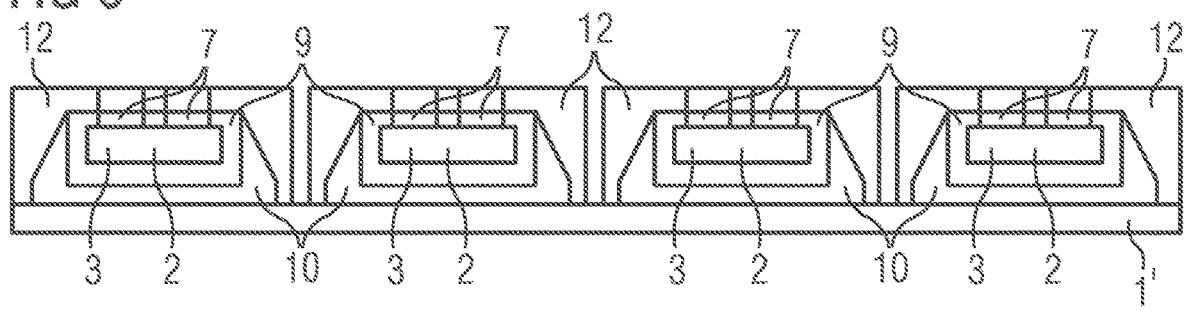
Figure 10:
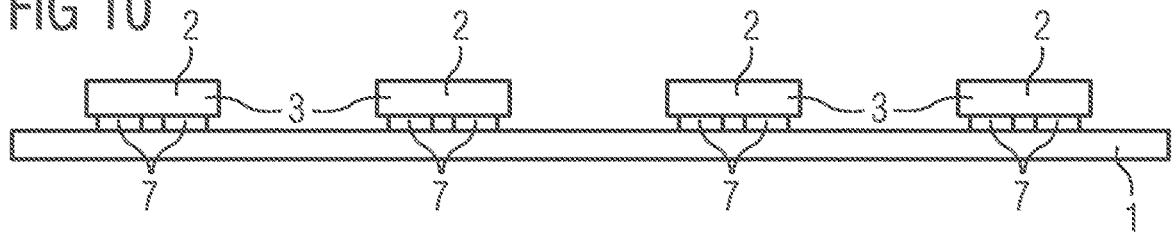
FIGS. 10 to 18 show schematic sectional views of a method according to a further exemplary embodiment.
Figure 11:
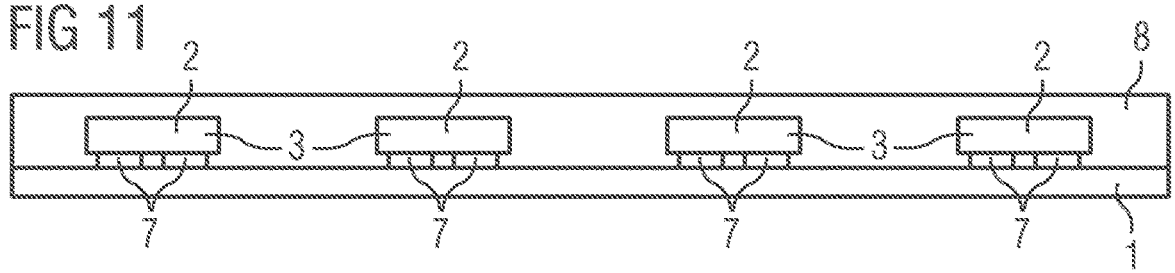
Figure 12:
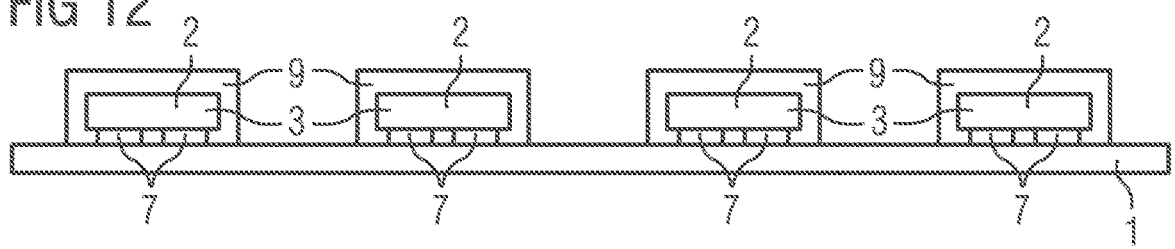
Figure 13:
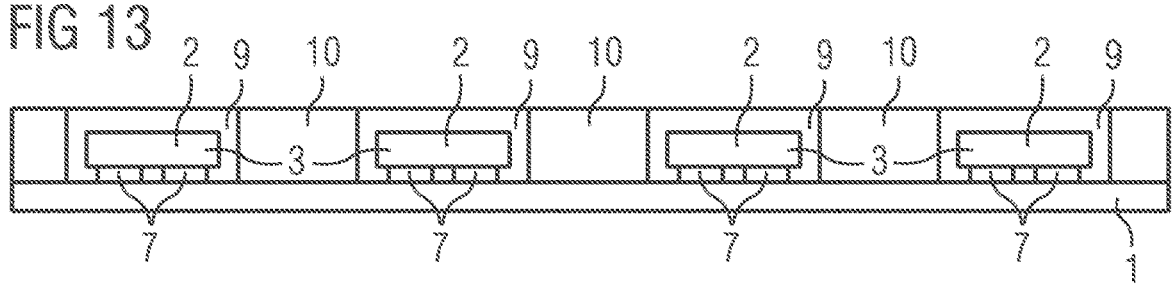
Figure 14:
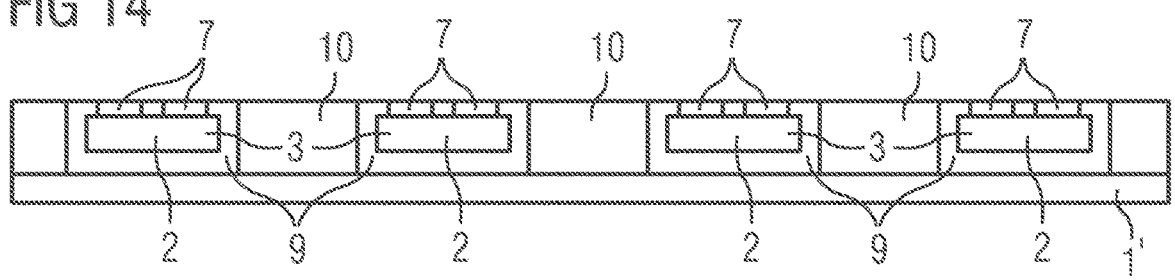
Figure 15:
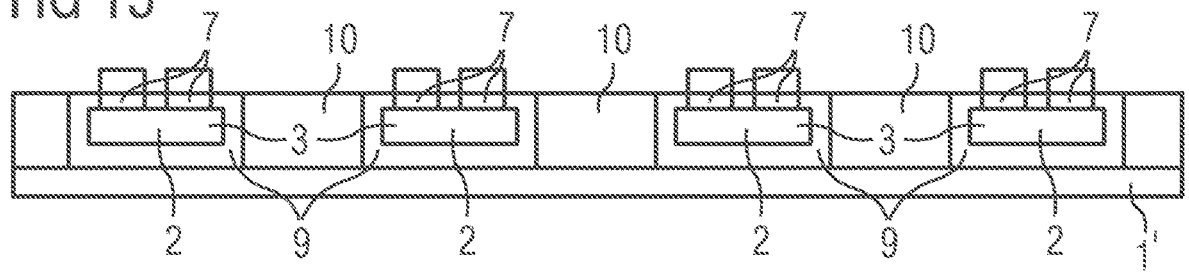
Figure 16:
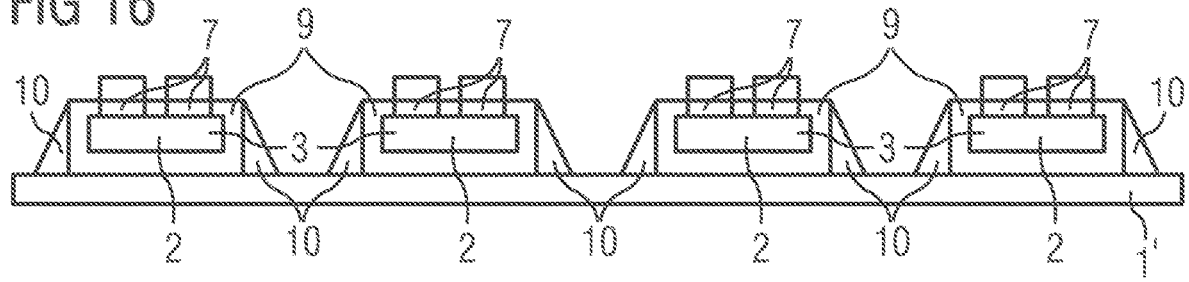
Figure 17:
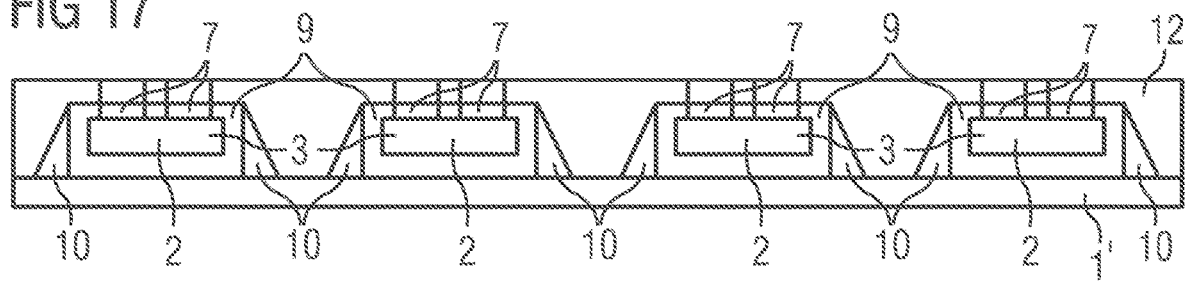
Figure 18:
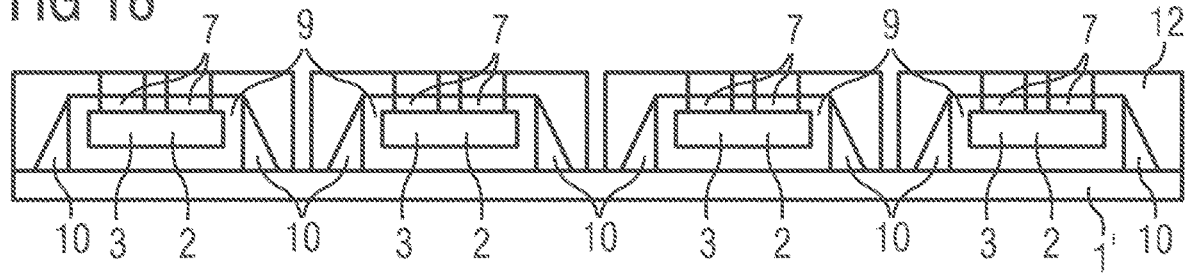
Figure 19:
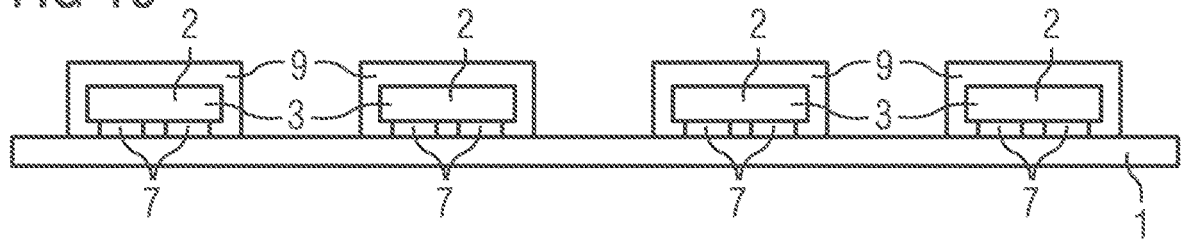
FIGS. 19 to 25 show schematic sectional views of a method according to a further exemplary embodiment.
Figure 20:
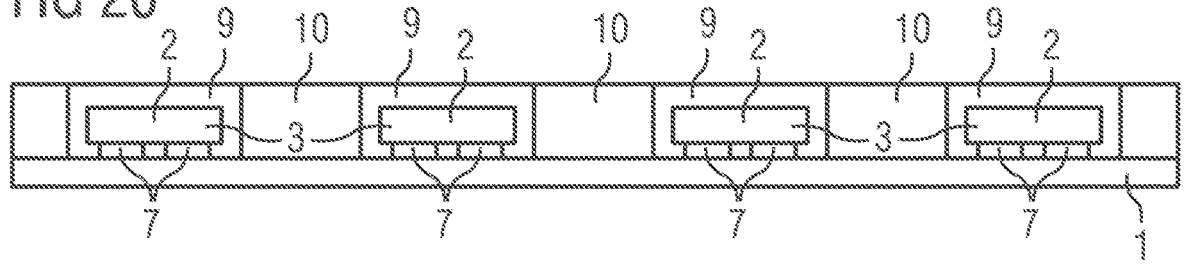
Figure 21:
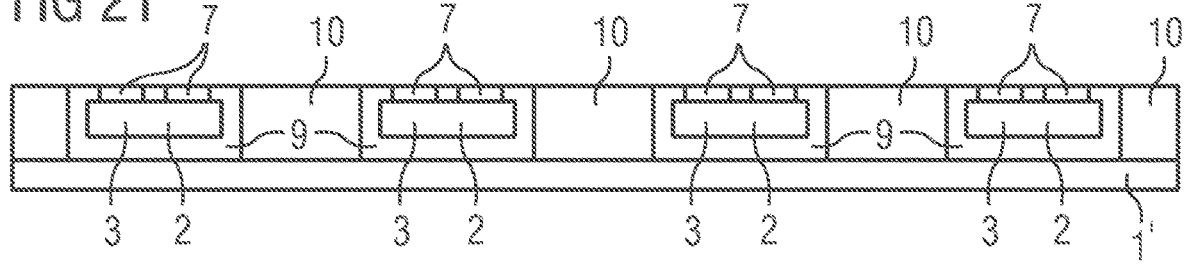
Figure 22:
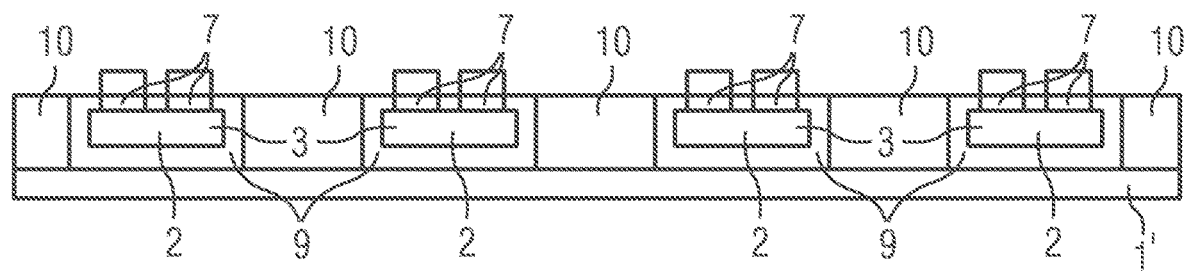
Figure 23:
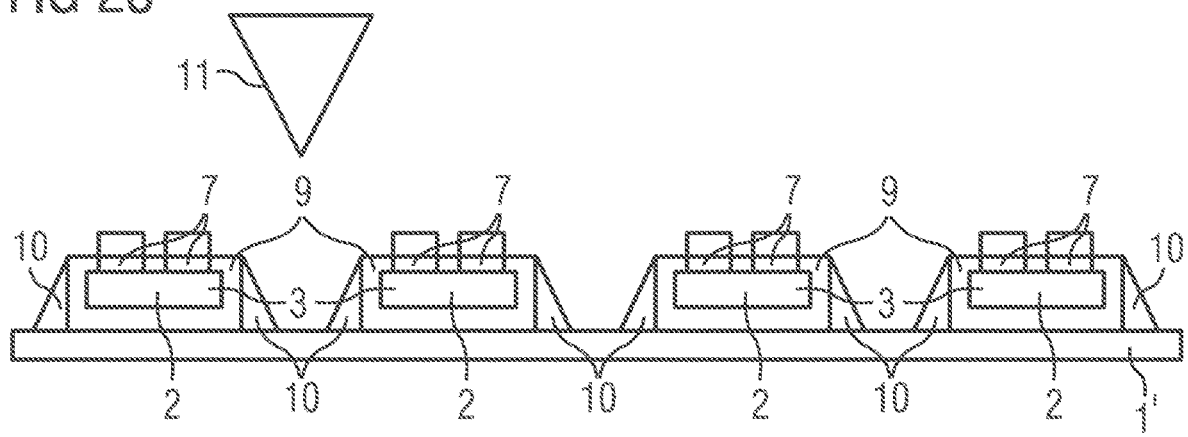
Figure 24:
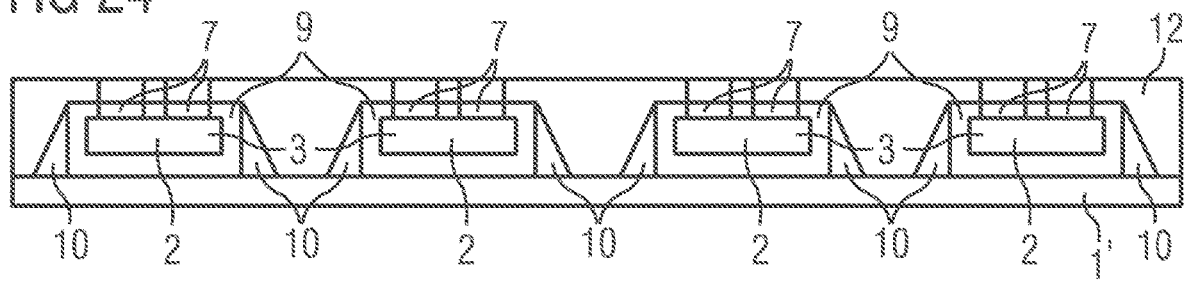
Figure 25:
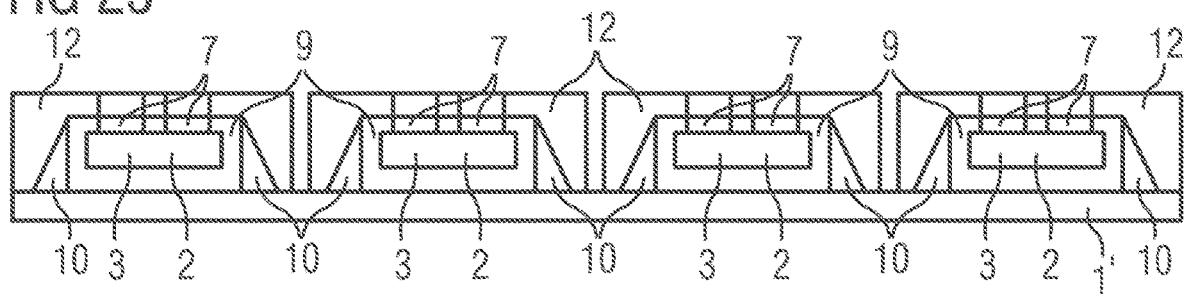

In a next step, which is schematically shown in FIG. 9, the semiconductor chip compound is completely cut through between two directly adjacent semiconductor chips 2 again to the further auxiliary carrier 1' by sawing. Herein, side faces of the third reflective casting compound 12 are formed, which are perpendicular to a main extension plane of the further auxiliary carrier 1'.

In contrast to the method according to the exemplary embodiment of FIGS. 1 to 9, the second clear casting compound 10 is applied to the semiconductor chip compound between the semiconductor chips 2 in such a way that the second clear casting compound 10 is flush with a surface of the wavelength-converting layer 9 in each case (FIG. 20) during the method of the exemplary embodiment of FIGS. 10 to 18. The remaining method steps correspond to the method steps, which have been already described on the basis of FIGS. 1 to 9.

In contrast to the method according to the exemplary embodiment of FIGS. 1 to 9, a plurality of radiation-emitting semiconductor chips 2, which are already provided with a wavelength-converting layer 9 on their radiation exit surfaces, are used (FIG. 19) during the method according to the exemplary embodiment of FIGS. 19 to 25. The following method steps according to FIGS. 20 to 25 correspond to the method steps according to FIGS. 13 to 18.

During the method according to the exemplary embodiment of FIGS. 26 to 31, again a plurality of radiation-emitting semiconductor chips 2 are, as already described on the basis of FIGS. 1 and 2, applied to an auxiliary carrier 1 and completely enveloped by a first wavelength-converting casting compound 8 (FIGS. 26 and 27).

Figure 28:
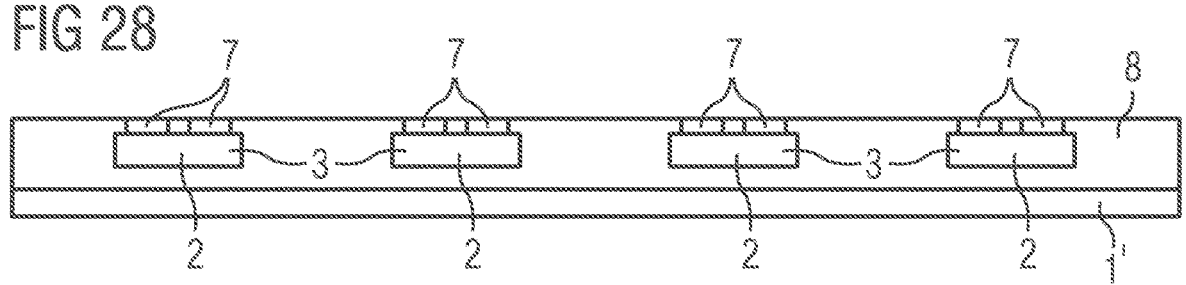

In a next step, which is shown schematically in FIG. 28, a further auxiliary carrier 1' is applied to the freely accessible main surface of the semiconductor chip compound and the first auxiliary carrier 1 is removed from the semiconductor conductor chip compound so that the second main surfaces of the electrical contacts 7 of the semiconductor chips 2 are freely accessible (FIG. 28).

Figure 29:
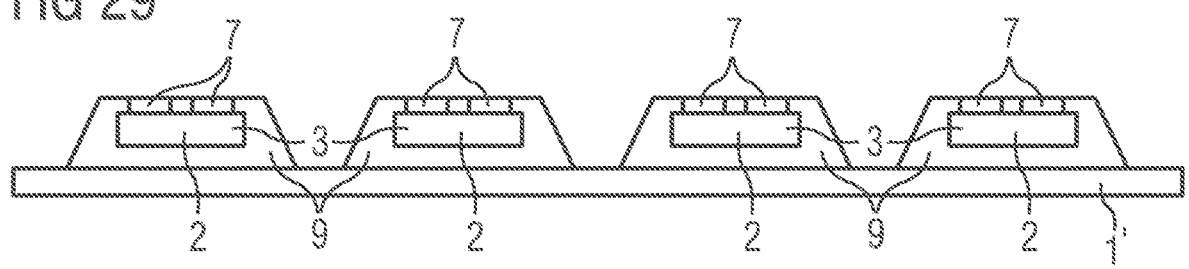

In a next step, which is schematically shown in FIG. 29, the first wavelength-converting casting compound 8 is completely cut through between two directly adjacent semiconductor chips 2 up to the auxiliary carrier 1' in each case. The auxiliary carrier 1' is not cut through hereby. A saw blade 11, which has a wedge-shaped profile, is used to cut the first wavelength-converting casting compound 8. In this way, outer surfaces of the wavelength-converting layer 9 are obtained, which are arranged obliquely to a normal of the main extension plane of the auxiliary carrier 1'.

Figure 30:
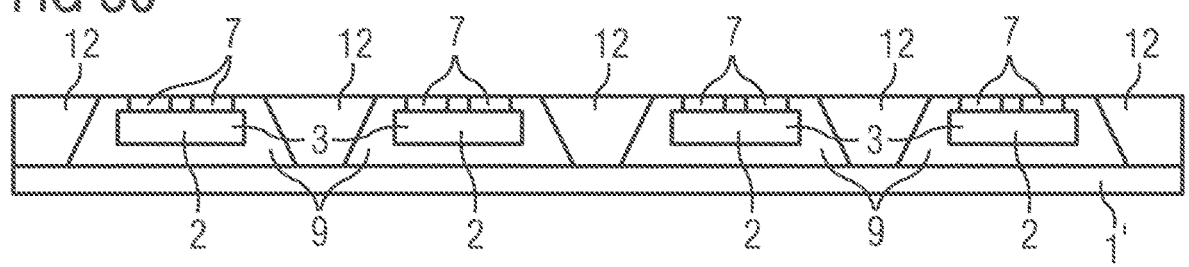

In a next step, which is shown schematically in FIG. 30, the gaps between the semiconductor chips 2 with the wavelength-converting layers 9 are completely filled with a third reflective casting compound 12. The third reflective casting compound 12 completely fills the gaps between two directly adjacent semiconductor chips 2 up to a surface, which is formed by the wavelength-converting layer 9 and the second main surfaces of the electrical contacts 7.

Figure 31:
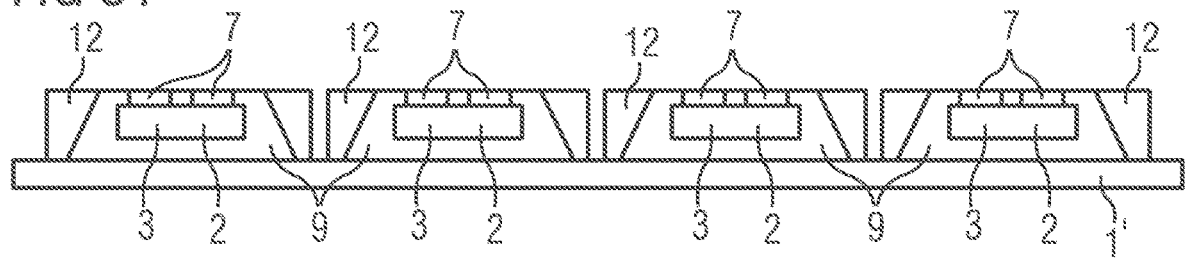

Finally, as shown schematically in FIG. 31, the third reflective casting compound 12 is cut through between two directly adjacent semiconductor chips 2 up to the auxiliary carrier 1' by sawing. Herein side faces of the third reflective casting compound 12 are formed, which are arranged perpendicular to the main extension plane of the auxiliary carrier.

Figure 26:
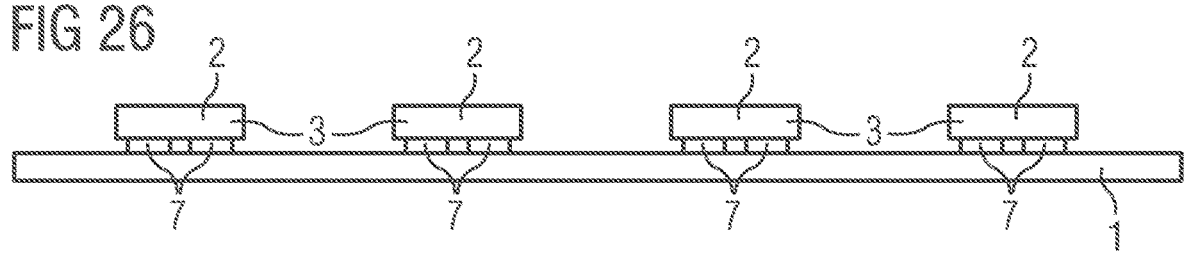
FIGS. 26 to 31 show schematic sectional views of a method according to a further exemplary embodiment.
Figure 27:
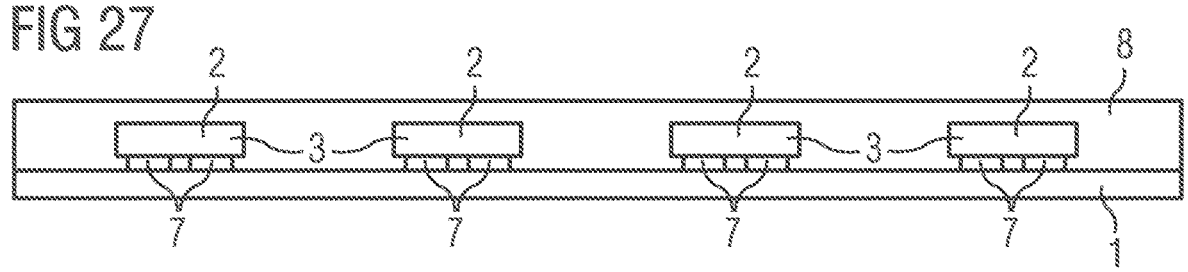

During the method according to the exemplary embodiment of FIGS. 32 to 37, the method steps as described on the basis of FIGS. 26 to 28 are carried out first (see FIGS. 32 to 34).

Figure 35:
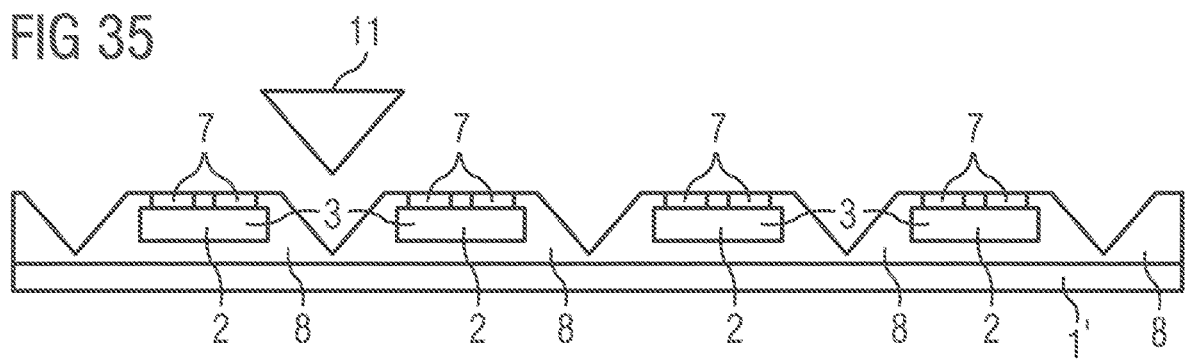

The semiconductor chip compound is then separated between two directly adjacent semiconductor chips 2 by sawing the first wavelength-converting casting compound 8. In contrast to the method according to the exemplary embodiment of FIGS. 26 to 31, the first reflective casting compound 8 is not completely cut through up to the auxiliary carrier 1'. Instead, a remainder of the first wavelength-converting casting compound 8 remains on the auxiliary carrier 1' (FIG. 35).

Figure 36:
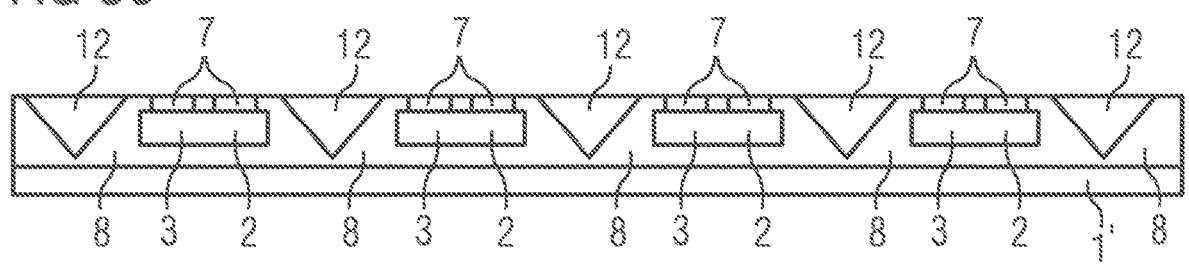

In a next step, the notches in the first wavelength-converting casting compound 8, which were formed by the sawing step, are completely filled with a third reflective casting compound 12 (FIG. 36).

Figure 37:
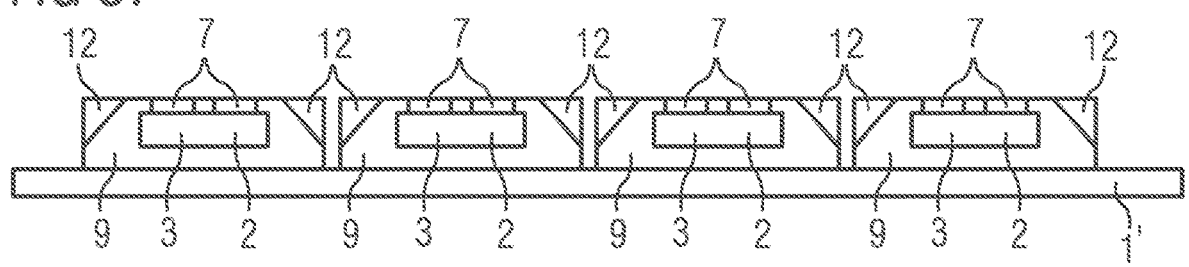
Figure 38:
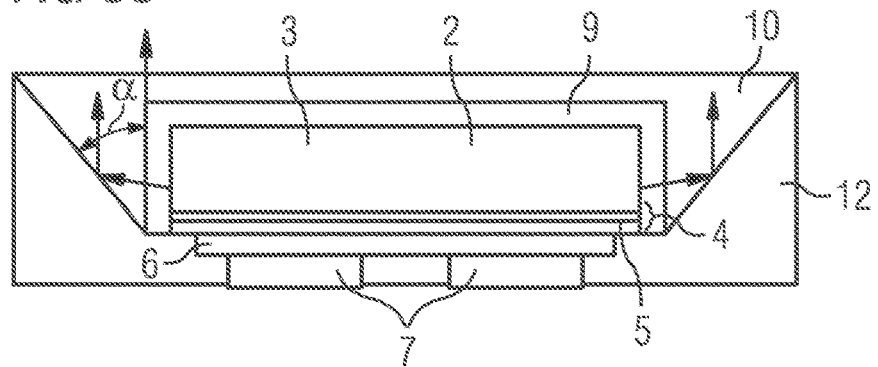

Now the semiconductor devices are separated by sawing between two directly adjacent semiconductor chips 2 up to the auxiliary carrier 1' (FIG. 37).

The radiation-emitting semiconductor device according to the exemplary embodiment of FIG. 38 has a radiation-emitting semiconductor chip 2 with a radiation transmissive carrier 3 comprising a first main surface and a second main surface. An epitaxial semiconductor layer sequence 4 with an active zone 5 is arranged on the second main surface of the carrier 3. The active zone 5 is suitable for generating electromagnetic radiation.

Furthermore, the semiconductor chip 2 comprises a mirror layer 6, which is applied to the epitaxial semiconductor layer sequence 4. On the mirror layer 6 are again two electrical contacts 7 arranged, which have a first main surface, which are adjacent to the mirror layer 6, and a second main surface, which lies opposite to the first main surface.

A wavelength-converting layer 9 is applied to the first main surface of the carrier 3 and the side faces of the carrier 3. The wavelength-converting layer 9, for example, is formed of a silicone with phosphor particles. The wavelength-converting layer 9 is suitable for converting electromagnetic radiation of the active zone 5 into radiation of a different wavelength range.

Furthermore, the semiconductor device according to the exemplary embodiment of FIG. 38 comprises a second clear casting compound 10. The second clear casting compound 10 completely envelops the carrier 3 with the wavelength-converting layer 9 applied to it. Furthermore, the second clear casting compound 10 forms oblique outer surfaces, which enclose, for example, an angle α between 30° and 80°, inclusive, with a normal of the main extension plane of carrier 3. Preferably, the angle α has a value between 45° and 60°, inclusive.

Furthermore, the semiconductor device according to the exemplary embodiment of FIG. 38 comprises a third reflective casting compound 12. The third reflective casting compound 12 envelops the second clear casting compound 10 as well as the back side of the semiconductor chip 2, namely the mirror layer 6 and the electrical contacts 7. The second main surfaces of the electrical contacts 7 are completely free of the third reflective casting compound 12.

The interface between the oblique outer surface of the second clear casting compound 10 and the third reflective casting compound 12 forms a reflector. The reflector directs electromagnetic radiation, which leaves the side faces of carrier 3, to a radiation exit surface of the semiconductor device, as indicated by the arrows in FIG. 38.

The semiconductor device according to the exemplary embodiment of FIG. 38 can, for example, be manufactured using a method as already described on the basis of FIGS. 1 to 9.

In contrast to the semiconductor device according to the exemplary embodiment of FIG. 38, the radiation-emitting semiconductor according to the exemplary embodiment of FIG. 39 has galvanically reinforced electrical contacts 7. The galvanically reinforced electrical contacts 7, for example, have two layers. For example, the first layer of electrical contacts 7 has a thickness between 1 micrometer and 2 micrometers inclusive, while the second layer of electrical contacts 7, which is galvanically deposited, reinforces the electrical contact 7 up to a thickness between 30 micrometers and 75 micrometers, inclusive. In the exemplary embodiment of FIG. 39, the third reflective casting compound 12 completely envelops the galvanically reinforced contacts 7 laterally, wherein the second main surfaces of the electrical contacts 7 remain freely accessible.

The semiconductor device according to the exemplary embodiment in FIG. 40 also has galvanically reinforced electrical contacts 7. However, in contrast to the semiconductor devices according to the FIGS. 38 and 39, the second clear casting compound 10 is not applied to a main surface of the wavelength-converting layer 9, but is only arranged on side faces of the wavelength-converting layer 9. The main surface of the wavelength-converting layer 9, which faces away from the carrier 3, is freely accessible at the semiconductor device according to FIG. 40. Such a semiconductor device can, for example, be produced using a method as described on the basis of FIGS. 10 to 18.

In contrast to the semiconductor devices according to the FIGS. 38 to 40, the semiconductor device according to the exemplary embodiment of FIG. 41 does not have a second clear casting compound 10. Instead, the semiconductor chip 2 is completely surrounded by a wavelength-converting layer 9, which has an oblique outer surface. The outer surface of the wavelength-converting layer 9 encloses an angle between 20° and 37.5°, inclusive, with the normal of a main extension plane of the semiconductor device. In the semiconductor device according to FIG. 41, the wavelength-converting layer 9 is completely surrounded laterally by the third reflective casting compound 12. The oblique outer surfaces of the wavelength-converting layer 9 form again a reflector together with the third reflective casting compound 12. Side faces of the semiconductor device according to FIG. 41 are completely formed by the third reflective casting compound 12. Such a semiconductor device can, for example, be produced using a method as already described on the basis of FIGS. 26 to 31.

In contrast to the semiconductor device according to FIG. 41, the semiconductor device according to the exemplary embodiment of FIG. 42 has side faces, which are formed partially by the third reflective casting compound 12 and partially by the first wavelength-converting casting compound 8. Such a semiconductor device can, for example, be produced using a method as already described on the basis of FIGS. 32 to 37.

In contrast to the semiconductor device according to FIG. 41, the semiconductor device according to the exemplary embodiment of FIG. 43 has galvanically reinforced rear electrical contacts 7, as already described on the basis of FIG. 39.

Figure 44:
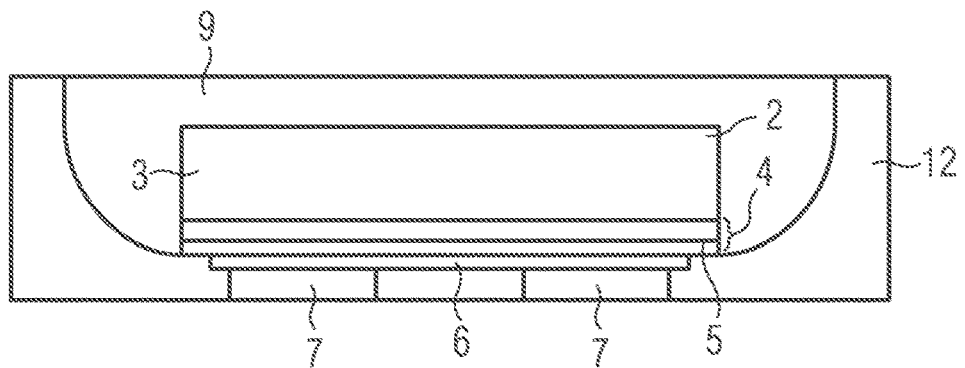

The radiation-emitting semiconductor device according to the exemplary embodiment of FIG. 44 has a wavelength-converting layer 9 with oblique outer surfaces which, in contrast to the exemplary embodiment of FIG. 43, are convexly curved. This has the advantage that electromagnetic radiation, which is generated in the active zone 5 and laterally decoupled from the epitaxial semiconductor layer sequence 4, is better directed to the radiation exit surface of the semiconductor device by the convex curvature of the interface between the reflective material of the third reflective casting compound 12 and the material of the wavelength-converting layer 9.

Figure 45:
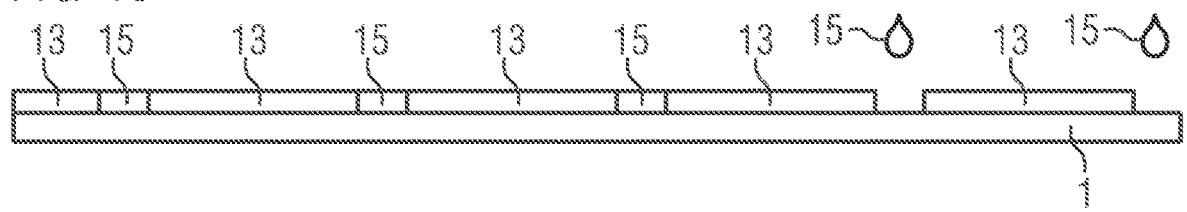
Figure 46:
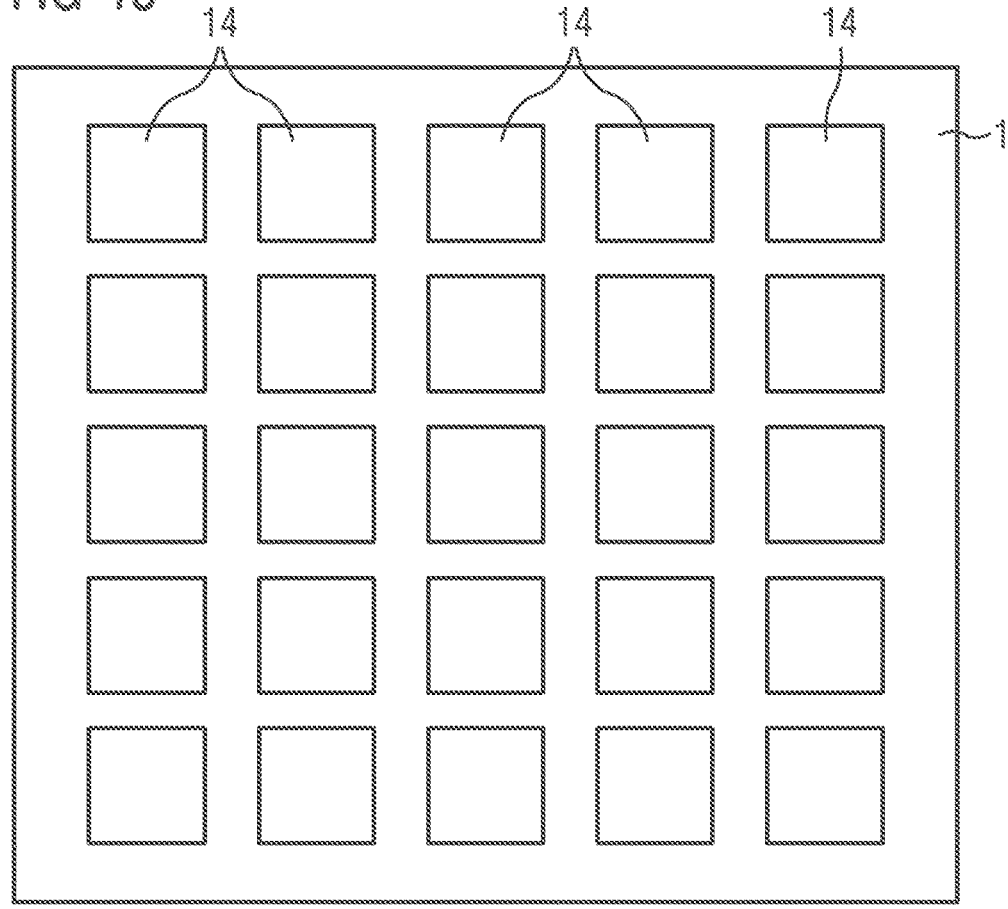

During the method according to the exemplary embodiment of FIGS. 45 to 51, an auxiliary carrier 1 is provided on which a first structured wavelength-converting layer 13 is applied, for example, by screen printing. The first wavelength-converting, structured layer 13 has a plurality of structural elements 14, as they are shown schematically in the plan view of FIG. 46. The structural elements 14 are embodied as rectangles arranged in columns and rows on the auxiliary carrier 1. Between the structural elements 14 of the first structured, wavelength-converting layer 13, a first reflective casting compound 15 is introduced, for example, by dispensing (FIG. 45). The first reflective casting compound 15 completely fills the gaps between the structural elements 14 of the first wavelength-converting structured layer 13.

As shown schematically in FIG. 47, a plurality of semiconductor chips is applied to the first structured wavelength-converting layer 13. Each semiconductor chip 2 is applied with a first main surface of its carrier 3 to exactly one structural element 14.

In a next step, which is schematically shown in FIG. 48, a second wavelength-converting layer 16 is arranged between the semiconductor chips 2 by applying a second wavelength-converting casting compound. The second wavelength-converting layer 16 preferably fills the gap between two directly adjacent semiconductor chips 2 completely. The second wavelength-converting layer 16 is preferably flush with the mirror layer 6 on the second main surface of carrier 3.

In a next step, which is schematically shown in FIG. 49, the second wavelength-converting layer 16 is cut through by sawing up to the first wavelength-converting layer 13. During the separation process, a saw blade 11 with a wedge-shaped profile is used so that the second wavelength-converting layer forms 16 oblique outer surfaces.

Figure 50:
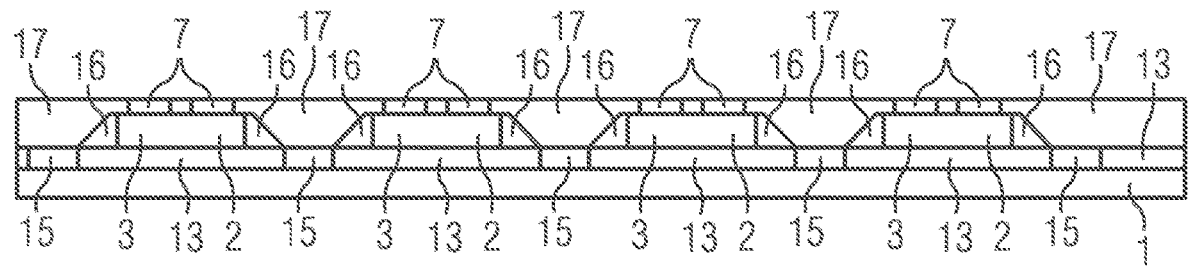

Then, as shown schematically in FIG. 50, a second reflective casting compound 17 is introduced between the semiconductor chips 2, for example, with dispensing, casting or molding. The second reflecting casting compound 17 completely fills a gap between the electrical contacts 7 of the semiconductor chips 2.

Figure 51:
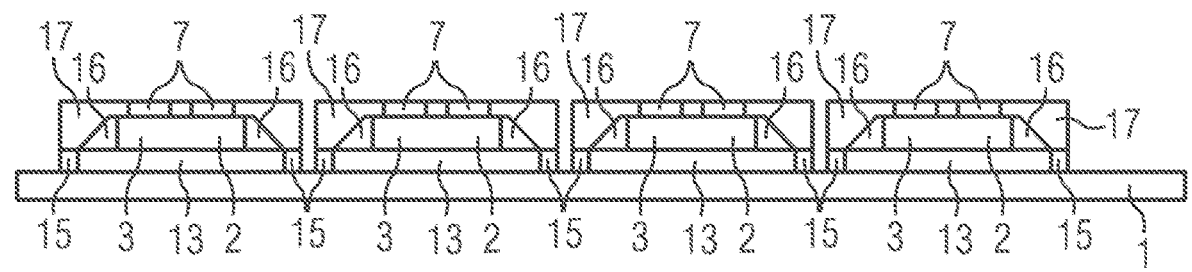

In a next step, which is schematically shown in FIG. 51, the first reflective casting compound 15 and the second reflective casting compound 17 are cut through between two directly adjacent semiconductor chips 2, also by sawing. Here side faces of the reflecting casting compounds 15, 17 are formed, which are arranged perpendicularly to a main extension plane of the auxiliary carrier 1. The reflecting casting compounds 15, 17 are completely cut through up to the auxiliary carrier 1.

Figure 52:
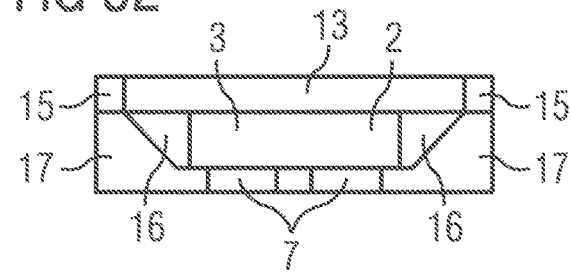
FIG. 52 shows a schematic sectional view of a radiation-emitting semiconductor device according to a further exemplary embodiment.

With the method described on the basis of FIGS. 45 to 51, a semiconductor device can be produced, for example, as shown in FIG. 52.

In contrast to the semiconductor device according to FIG. 41, the semiconductor device according to the exemplary embodiment of FIG. 52 has a wavelength-converting layer 9 formed of a first wavelength-converting layer 13 and a second wavelength-converting layer 16. The first wavelength converting layer 13 and the second wavelength converting layer 16 can have different materials. For example, the first wavelength converting layer 13 on the side faces of the semiconductor chip 2 has a wavelength converting material different from the material of the second wavelength converting layer 16 on the first main face of the carrier 3. In particular, the wavelength converting materials can differ in their silicone resin or phosphor particles. The reflective casting compound of the semiconductor device according to FIG. 52 is also composed of two layers, namely the first reflective casting compound 15 and the second reflective casting compound 17.

The invention is not limited to the description of the embodiments. Rather, the invention comprises each new feature as well as each combination of features, particularly each combination of features of the claims, even if the feature or the combination of features itself is not explicitly given in the claims or embodiments.

The invention claimed is:

1. A method for manufacturing a plurality of radiation-emitting semiconductor devices, the method comprising:
    providing an auxiliary carrier;
    applying a plurality of radiation-emitting semiconductor chips with their back sides to the auxiliary carrier;
    applying a first casting compound such that a semiconductor chip compound is formed;
    separating the semiconductor chip compound between two semiconductor chips by sawing so that the auxiliary carrier is not cut through and so that a layer of the first casting compound is produced at least on side faces of the semiconductor chips;
    applying a second clear casting compound to the semiconductor chip compound; and
    separating the semiconductor chip compound by sawing between two semiconductor chips through the second clear casting compound so that the auxiliary carrier is not cut through and so that a layer of the second clear casting compound with an oblique outer surface is formed on the side faces of the layer of the first casting compound.

2. The method according to claim 1,
    wherein each semiconductor chip comprises a radiation-transmissive carrier having a first main surface and side faces which together form a radiation exit surface of the semiconductor chip,
    wherein the first casting compound is wavelength converting, and
    wherein the semiconductor chip compound is separated such that a wavelength-converting layer is formed on the first main surface of the radiation-transmissive carrier and the side faces of the radiation-transmissive carrier.

3. The method according to claim 1, wherein the oblique outer surface is formed by sawing the first casting compound or the second clear casting compound.

4. The method according to claim 1, wherein the second clear casting compound is applied such that it fills gaps between the semiconductor chips up to a surface of the layer of the first casting compound so that the layer of the second clear casting compound and the layer of the first casting compound are flush with one another.

5. The method according to claim 1,
wherein the first casting compound is wavelength converting, and
wherein the first casting compound is completely cut through to the auxiliary carrier.

6. The method according to claim 1, wherein the first casting compound is not completely cut through to the auxiliary carrier so that a remainder of the first casting compound remains on the auxiliary carrier.

7. The method according to claim 6, wherein remainder of the first casting compound located on the auxiliary carrier has a thickness in a vertical direction between 10 micrometers and 100 micrometers, inclusive.

8. The method according to claim 6, wherein the outer surfaces of the layer of the first casting compound are formed obliquely during separation.

9. The method according to claim 1, further comprising applying a third reflective casting compound to the semiconductor chip compound, wherein the semiconductor chip compound is separated by sawing between two semiconductor chips through the third reflective casting compound, and wherein the auxiliary carrier is not cut through.

10. The method according to claim 1, further comprising:
removing the auxiliary carrier so that the at least one rear electrical contact of each semiconductor chip is freely accessible; and
galvanically reinforcing the at least one rear electrical contact of each semiconductor chip.

11. The method according to claim 1, wherein applying the semiconductor chips comprises applying the semiconductor chips with a wavelength-converting layer.

12. A method for manufacturing a plurality of radiation-emitting semiconductor devices, the method comprising:
providing an auxiliary carrier;
applying a first structured wavelength converting layer to the auxiliary carrier comprising a plurality of structural elements;
filling regions between the structural elements with a first reflective casting compound; and
applying a radiation-emitting semiconductor chip with its front side to one structural element of the first structured wavelength converting layer in each case.

13. The method according to claim 12, further comprising filling gaps between the semiconductor chips with a second wavelength-converting casting compound.

14. The method according to claim 13, wherein the second wavelength-converting casting compound is separated between two directly adjacent semiconductor chips up to the first reflective casting compound by sawing so that a second wavelength-converting layer is formed on side faces of each semiconductor chip.

15. The method according to claim 14, wherein sawing of the second wavelength-converting casting compound comprises forming oblique outer surfaces of the second wavelength-converting layer.

16. The method according to claim 12, further comprising applying a second reflecting casting compound thereby enveloping the semiconductor chips so that second main surfaces of electrical contacts are freely accessible.

17. The method according to claim 16, further comprising galvanically reinforcing the electrical contacts of the semiconductor chips.

18. The method according to claim 16, further comprising separating the second reflecting casting compound by sawing so that outer surfaces of the second reflecting casting compound are formed which are perpendicular to a main extension plane of the auxiliary carrier.

19. A radiation-emitting semiconductor device comprising: a semiconductor chip comprising:
a radiation-transmissive carrier;
an epitaxial semiconductor layer sequence arranged at the carrier;
a mirror layer arranged at the epitaxial semiconductor layer sequence; and
two electrical contacts arranged on a back side of the semiconductor chip;
a wavelength-converting layer completely covering side faces of the carrier and a first main surface of the carrier, the wavelength-converting layer having saw traces on the side faces of the carrier;
a reflective casting compound enveloping the semiconductor chip, wherein first main surfaces of the electrical contacts are freely accessible; and
a second clear casting compound having an oblique outer surface and being arranged at side faces of the carrier on the wavelength-converting layer, wherein the reflective casting compound envelops the semiconductor chip and the second clear casting compound.

20. The radiation-emitting semiconductor device according to claim 19, wherein the wavelength-converting layer on the side faces of the carrier has a thickness whose thickness variation is not greater than 25%.

21. The radiation-emitting semiconductor device according to claim 19, wherein the wavelength-converting layer on the first main surface of the carrier has a thickness whose thickness variation is not greater than 5%.

22. The radiation-emitting semiconductor device according to claim 19, wherein the wavelength-converting layer on the first main surface of the carrier is also completely covered by the second clear casting compound.

23. The radiation-emitting semiconductor device according to claim 19, in which
the wavelength-converting layer on the side faces of the carrier has an oblique outer surface.

24. The radiation-emitting semiconductor device according to claim 23, wherein side faces of the semiconductor device are partially formed by a wavelength converting layer material.

25. The radiation-emitting semiconductor device according to claim 19, wherein the electrical contacts comprise two metallic layers, one of which is a galvanic layer.

26. The radiation-emitting semiconductor device according to claim 19, wherein the electrical contacts have a thickness between 30 micrometers and 75 micrometers, inclusive.

27. The radiation-emitting semiconductor device according to claim 19, wherein the wavelength-converting layer on the first main surface of the carrier is formed of a different material than on the side faces of the carrier.

28. The radiation-emitting semiconductor device according to claim 27, wherein the wavelength-converting layer on the first main surface of the carrier comprises silicone as matrix, and wherein the wavelength-converting layer on the side facing the carrier does not comprise silicone as matrix.

* * * * *